US012164062B2

(12) United States Patent
Vaello Paños et al.

(10) Patent No.: US 12,164,062 B2
(45) Date of Patent: Dec. 10, 2024

(54) TIME OF FLIGHT SENSORS WITH LIGHT DIRECTING ELEMENTS

(71) Applicant: AMS INTERNATIONAL AG, Jona (CH)

(72) Inventors: Miguel Bruno Vaello Paños, Eindhoven (NL); David Stoppa, Eindhoven (NL)

(73) Assignee: AMS INTERNATIONAL AG, Jona (CH)

( * ) Notice: Subject to any disclaimer, the term of this patent is extended or adjusted under 35 U.S.C. 154(b) by 427 days.

(21) Appl. No.: 17/618,446

(22) PCT Filed: Jun. 9, 2020

(86) PCT No.: PCT/EP2020/065966
§ 371 (c)(1),
(2) Date: Dec. 11, 2021

(87) PCT Pub. No.: WO2020/254152
PCT Pub. Date: Dec. 24, 2020

(65) Prior Publication Data
US 2022/0357433 A1 Nov. 10, 2022

Related U.S. Application Data

(60) Provisional application No. 62/862,951, filed on Jun. 18, 2019.

(51) Int. Cl.
*G01S 7/4863* (2020.01)
*G01S 7/481* (2006.01)
(Continued)

(52) U.S. Cl.
CPC .......... *G01S 7/4863* (2013.01); *G01S 7/4816* (2013.01); *H01L 27/14612* (2013.01);
(Continued)

(58) Field of Classification Search
CPC .... G01S 7/4863; G01S 7/4816; G01S 7/4865; G01S 17/18; G01S 17/89;
(Continued)

(56) References Cited

U.S. PATENT DOCUMENTS

2009/0224139 A1* 9/2009 Buettgen ............... G01S 17/894
348/E13.001
2011/0085067 A1 4/2011 Venezia
(Continued)

OTHER PUBLICATIONS

IR Sensitivity Enhancement of CMOS Image Sensor with Diffractive Light Trapping Pixels.â Scientific reports 7.1 (2017): 3832â9 (Year: 2017).*
(Continued)

*Primary Examiner* — Thanh Luu
*Assistant Examiner* — Monica T Taba
(74) *Attorney, Agent, or Firm* — VIERING, JENTSCHURA & PARTNER mbB (57) ABSTRACT

A time of flight sensor includes at least one demodulation pixel. Each demodulation pixel includes a semiconductor substrate; a charge generation region in the semiconductor substrate, the charge generation region having a lateral extent, the charge generation region being configured to convert light into charge carriers; a light directing element in the charge generation region of the semiconductor substrate, the light directing element being configured to direct light through at least a portion of the lateral extent of the charge generation region; a collection region in the semiconductor substrate, the collection region being configured to collect the charge carriers generated in at least a portion of the lateral extent of the charge generation region, and a readout component in electrical communication with the collection region, the readout component being operable to control an electrical coupling between the charge generation region and the collection region.

18 Claims, 11 Drawing Sheets

(51) Int. Cl.
  *G01S 7/4865* (2020.01)
  *H01L 27/146* (2006.01)
  *H01L 27/148* (2006.01)
  *G01S 17/18* (2020.01)
  *G01S 17/89* (2020.01)

(52) U.S. Cl.
  CPC .. *H01L 27/14812* (2013.01); *H01L 27/14818* (2013.01); *G01S 7/4865* (2013.01); *G01S 17/18* (2020.01); *G01S 17/89* (2013.01); *H01L 27/14649* (2013.01)

(58) Field of Classification Search
  CPC ......... H01L 27/14612; H01L 27/14812; H01L 27/14818; H01L 27/14649
  See application file for complete search history.

(56) References Cited

U.S. PATENT DOCUMENTS

| | | | |
|---|---|---|---|
| 2011/0187908 A1 | 8/2011 | Kawahito | |
| 2014/0145281 A1* | 5/2014 | Bever | H01L 31/035272 |
| | | | 257/431 |
| 2015/0211935 A1 | 7/2015 | Ojima | |
| 2016/0356718 A1* | 12/2016 | Yoon | H03M 3/464 |
| 2019/0019899 A1* | 1/2019 | Wang | H01L 31/02 |

OTHER PUBLICATIONS

International Search Report and Written Opinion for corresponding PCT Patent Application No. PCT/EP2020/065966 dated Jul. 15, 2020.

\* cited by examiner

TIME OF FLIGHT SENSORS WITH LIGHT DIRECTING ELEMENTS

RELATED APPLICATIONS

The present invention is a U.S. National Stage under 35 USC 371 patent application, claiming priority to Serial No. PCT/EP2020/065966, filed on Jun. 9, 2020; which claims priority from U.S. Provisional Patent Application No. 62/862,951 filed Jun. 18, 2019; the entirety of both are incorporated herein by reference.

BACKGROUND

Three-dimensional (3-D) imaging enables a depth representation of a scene to be captured. 3-D imaging systems employ an illumination source, e.g., in the infrared, and a sensor. The illumination source of a 3-D imaging system can be a modulated illumination source, and the sensor can include pixels for sensing the illumination light reflected from the scene, such as lock-in pixels or single photon avalanche diodes. The modulation frequency or pulse length for the illumination can depend on factors such as the distance range and the desired precision of the resulting image, and can range as high as several hundred megahertz (for the modulation frequency) or as short as several picoseconds (for the pulse length).

SUMMARY

In an aspect, a time of flight sensor includes at least one demodulation pixel. Each demodulation pixel includes a semiconductor substrate; a charge generation region in the semiconductor substrate, the charge generation region having a lateral extent, the charge generation region being configured to convert light into charge carriers; a light directing element in the charge generation region of the semiconductor substrate, the light directing element being configured to direct light through at least a portion of the lateral extent of the charge generation region; a collection region in the semiconductor substrate, the collection region being configured to collect the charge carriers generated in at least a portion of the lateral extent of the charge generation region, and a readout component in electrical communication with the collection region, the readout component being operable to control an electrical coupling between the charge generation region and the collection region.

Embodiments may include one or more of the following features.

The time of flight sensor includes an aperture aligned with a portion of the charge generation region, the aperture being smaller than the lateral extent of the charge generation region.

The light directing element includes a diffraction element.

Each demodulation pixel includes an electric field gate disposed on the charge generation region, the electric field gate being configured to generate a potential gradient along at least a portion of the lateral extent of the charge generation region.

The semiconductor substrate in the charge generation region has a doping gradient.

The charge generation region includes multiple sub-regions, the semiconductor substrate in each of the sub-regions having a different doping concentration.

In an aspect, a time of flight sensor system includes a modulated light source; and a sensor configured to detect light generated by the modulated light source and reflected by an object, the sensor including the time of flight sensor of any of the foregoing aspects or features.

Embodiments may include one or more of the following features.

The time of flight sensor system includes one or more processors configured to generate an image of the object based on a signal determined from the collected charge carriers. The one or more processors are configured to generate a three-dimensional image of the object based on the signal and based on a two-dimensional image of the object.

The time of flight sensor system includes one or more processors configured to determine a distance between the object and the sensor.

In an aspect, a method for operating a time of flight sensor includes, in a charge generation region of a semiconductor substrate of a demodulation pixel, converting light into charge carriers, the charge generation region having a lateral extent; directing light through at least a portion of the lateral extent of the charge generation region; and collecting the charge carriers generated in at least a portion of the lateral extent of the charge generation region.

Embodiments may include one or more of the following features.

The method includes receiving light in the charge generation region through an aperture, the aperture being smaller than the lateral extent of the charge generation region.

Directing light through the charge generation region includes diffracting light in the charge generation region.

The method includes controlling an electrical coupling between the charge generation region and a collection region in which the charge carriers are collected. Controlling an electrical coupling between the charge generation region and the collection region includes applying a voltage to a readout component.

The method includes generating a potential gradient along at least a portion of the lateral extent of the charge generation region. Generating a potential gradient includes applying a voltage to each of one or more electric field gates disposed on the charge generation region. Generating a potential gradient includes providing a doping gradient in the charge generation region of the semiconductor substrate.

The method includes illuminating an object with modulated light; and receiving, at the charge generation region, light reflected by the object. The method includes generating an image of the object based on a signal determined from the collected charge carriers. The method includes generating a three-dimensional image of the object based on the signal and based on a two-dimensional image of the object.

The approaches described here can have one or more of the following advantages. The containment of charge carrier generation within or near the depletion region of time of flight sensors enables the sensors to operate at high speed and with high sensitivity to light and high quantum efficiency. The sensitivity and quantum efficiency of the time of flight sensors can also be enhanced by an increase in the extent of the depletion region of the time of flight sensors.

The details of one or more implementations are set forth in the accompanying drawings and the description below. Other features and advantages will be apparent from the description and drawings, and from the claims.

DETAILED DESCRIPTION

We describe here time of flight sensors having demodulation pixels that incorporate light directing elements, such as diffraction elements, into the charge generation regions in which light is converted into charge carriers. The light directing elements direct light in the charge generation regions to stay near the surface, and as a result, photogenerated charge carriers also stay near the surface and generally close to a depletion region in the charge generation region. Charge carriers generated within the depletion region are rapidly sensed, so by containing light and the photogenerated charge carriers near the depletion region, the time of flight sensors can be operated with fast response times, high efficiency, and high sensitivity. By increasing the lateral extent of the charge generation region, the interaction volume between light and the depletion region can be increased, which can further enhance the sensitivity of the time of flight sensors. In some examples, potential gradients can be created in the charge generation regions to further enhance the speed, efficiency, and sensitivity of the time of flight sensors.

Figure 1:
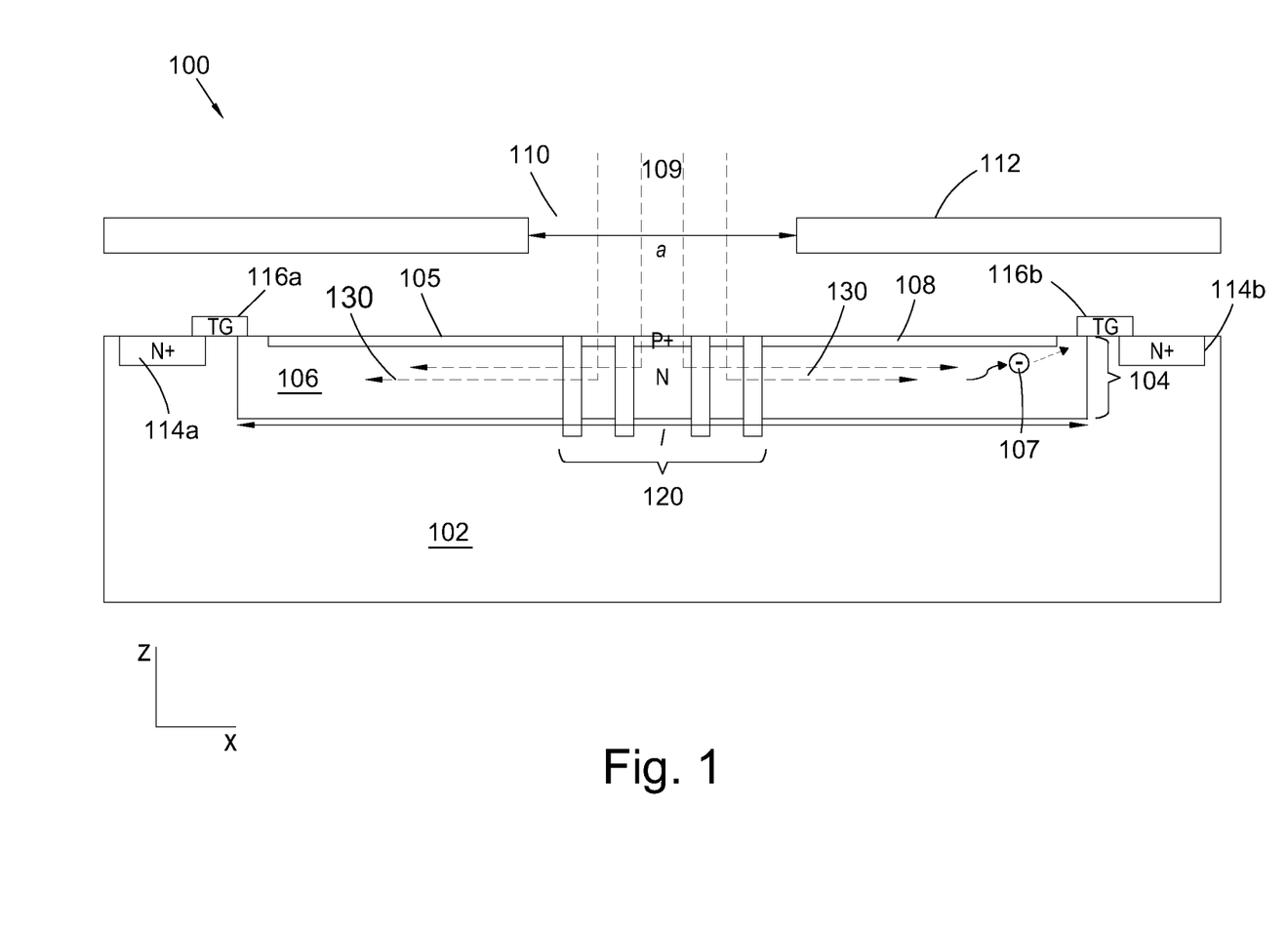
FIGS. 1-6 are diagrams of time of flight sensors.

FIG. 1 shows a demodulation pixel 100 of a time of flight sensor. The time of flight sensor can include multiple such demodulation pixels 100, such as a two-dimensional (2-D) array of demodulation pixels. In some examples, the time of flight sensor can be part of an imaging sensor, such as for three-dimensional (3-D) imaging of an environment, e.g., for facial recognition, mapping, or other applications. In some examples, the time of flight sensor can be part of a proximity sensor for determining the proximity of the sensor to an object in the environment. The demodulation pixels 100 of the time of flight sensor detect light from the environment, e.g., light reflected by an object in the environment, and signals output from the demodulation pixels 100 are used, e.g., to construct 3-D images or maps or for proximity determination.

The demodulation pixel 100 includes a semiconductor substrate 102 having multiple regions defined in the semiconductor substrate 102, e.g., by doping of the semiconductor substrate 102. For instance, the demodulation pixel 100 can be a complementary metal-oxide-semiconductor structure.

A charge generation region 104 is defined in the semiconductor substrate 102. Radiation (e.g., light) is incident on at least a portion of a surface 105 of the charge generation region 104. In the charge generation region 104, light is converted into charge carriers 107, such as electrons or holes. The type of charge carriers can depend on the nature of the doping of the charge generation region 104. For instance, in an n-type charge generation region, light is converted into electrons. In a p-type charge generation region, light is converted into holes.

In some examples, the charge generation region 104 can include multiple implant regions, each having a different doping concentration. In the example of FIG. 1, the charge generation region 104 includes a deep n-type charge generation region 106 and a shallow p+-type implant region 108. The deep n-type charge generation region 106 extends laterally beyond the shallow p+-type implant region 108 to create an electrical connection to the substrate 102. Other types of doping can also be used to form the implant regions of the charge generation region.

The doping profile formed by the multiple implant regions 106, 108 gives rise to a depletion region 130 in the charge generation region 104. A depletion region is a region in which the semiconductor substrate 102 (e.g., the silicon) is at least partially depleted of electrical charges. Charge carriers generated within the depletion region are sensed rapidly by a sensing node of the demodulation pixel 100, e.g., by a collection region 114 (discussed below). Some charge carriers generated outside of the depletion region travel by diffusion toward the depletion region, and are sensed upon arrival into the depletion region, with a time delay that is based on the diffusion distance. Some charge carriers generated outside of the depletion region can be lost to recombination.

In some examples, light 109 is incident on the charge generation region 104 through an aperture 110 defined in a shield layer 112. The shield layer 112 can be formed of a material, such as a metal, that is not transparent to the wavelength of the incident light. The shield layer 112 protects elements of the demodulation pixel 100 from the incident light, while allowing incident light to impinge on the charge generation region 104 through the aperture 110. The size a (e.g., diameter) of the aperture 108 is smaller than a lateral extent l of the charge generation region 104 such that light is incident on less than the entire surface 106 of the charge generation region 104. In the example of FIG. 1, the aperture is substantially centered relative to the charge generation region 104; in some examples, the aperture can be positioned elsewhere.

The demodulation pixel 100 includes one or more collection regions 114 (here, two collection regions 114a, 114b). In the example of FIG. 1, the collection regions 114 are positioned at opposite ends of the charge generation region 104. The collection regions 114 are defined in the semiconductor substrate 102, e.g., by doping. In the example of FIG. 1, the collection regions 114 are n+ type regions. Charge carriers generated in the charge generation region 104 are collected in the collection regions 114, from where the charge carriers can be output and converted to a current or voltage signal.

A readout component 116a, 116b is positioned on the surface of the semiconductor substrate 102 and in contact with both the charge generation region 104 and the corresponding collection region 116a, 116b. The readout components 116 can be, e.g., polysilicon gates. Application of a voltage to a readout component 116 controls an electrical coupling between the charge generation region 104 and the corresponding collection region 114 by generating an electric field that opens a channel in the semiconductor substrate 102 between the charge generation region 104 and the collection region 114. Charge carriers from the depletion region 130 of the charge generation region 104 can then flow to the collection region 114 for collection.

One or more light directing elements 120, such as diffractive optical elements, are positioned in the charge generation region 104. The light directing elements 120 are configured to direct, e.g., diffract, light through at least a portion of the lateral extent l of the charge generation region 104. For instance, light propagating in the charge generation region 104 in a direction z substantially orthogonal to the surface 105 of the charge generation region 104 can be directed by the light directing elements 120 to a direction x substantially parallel to the surface 105, towards the collection regions 114.

In a demodulation pixel without optical elements, light, such as infrared light, can penetrate deeply into the semiconductor substrate, creating a deep charge generation region. This deep penetration of light results in the generation of charge carriers deep in the substrate. In some examples, it can take a significant amount of time for these deep charge carriers to arrive at the collection elements, limiting the speed of the demodulation pixel. In some cases, these deep charge carriers can even not arrive at the collection elements at all, e.g., because the charge carriers are too deep to be affected by the electric field generated by the readout components 116, thus also limiting the sensitivity of the demodulation pixel.

The presence of the light directing elements 120 reduces the depth to which light penetrates into the substrate 102 by directing, e.g., diffracting, the light. This action keeps the light (and hence the generation of charge carriers) generally close to the surface 105 of the charge generation region and, moreover, generally close to the depletion region 130. In some cases, these surface-localized charge carriers are generated in the depletion region 130, from where they are substantially immediately sensed at the collection regions 114. In some cases, surface-localized charge carriers are generated outside of, but generally near, the depletion region 130, and these charge carriers can diffuse quickly to the depletion region 130 quickly, from where they can be sensed. The localization of photogenerated charge carriers near the surface, and in or near the depletion region 130, thus can enhance the speed of the demodulation pixel 100. In addition, many, e.g., most, of the generated charge carriers are close enough to the surface 105 to be subject to the electric fields generated by the readout components 116, enabling a high sensitivity to be achieved.

In some examples, the lateral extent l of the charge generation region 104 (and thus also the lateral extent of the depletion region 130) can be extended relative to the extent of a charge generation region in a demodulation pixel without light directing elements to extend the depletion region and hence the interaction volume between absorbed light and the depletion region. Extending the lateral extent l of the charge generation region 104 can further enhance the sensitivity of the demodulation pixel 100, e.g., because of the larger interaction volume that is available for the conversion of light into charge carriers.

The light directing elements 120 can be diffractive elements, such as multilayer structures formed of materials having refractive indices selected to diffract light of a target wavelength. For instance, the light directing elements 120 can be formed by defining trenches in the charge generation region 104 and filling the trenches with multiple, vertically oriented layers of materials, such as oxides or nitrides. In the example of FIG. 1, the light directing elements 120 are positioned in the area of the charge generation region 104 that is aligned with the aperture 110; in some examples, the optical elements 120 can be positioned elsewhere in the charge generation region, such as in regions of the charge generation region 104 that do not receive directly incident light.

In some examples, the light directing elements 120 can include a photonic grating, e.g., a photonic grating that includes multiple trenches filled with an oxide. For instance, the photonic grating can be a photonic Blaze grating.

Figure 2:
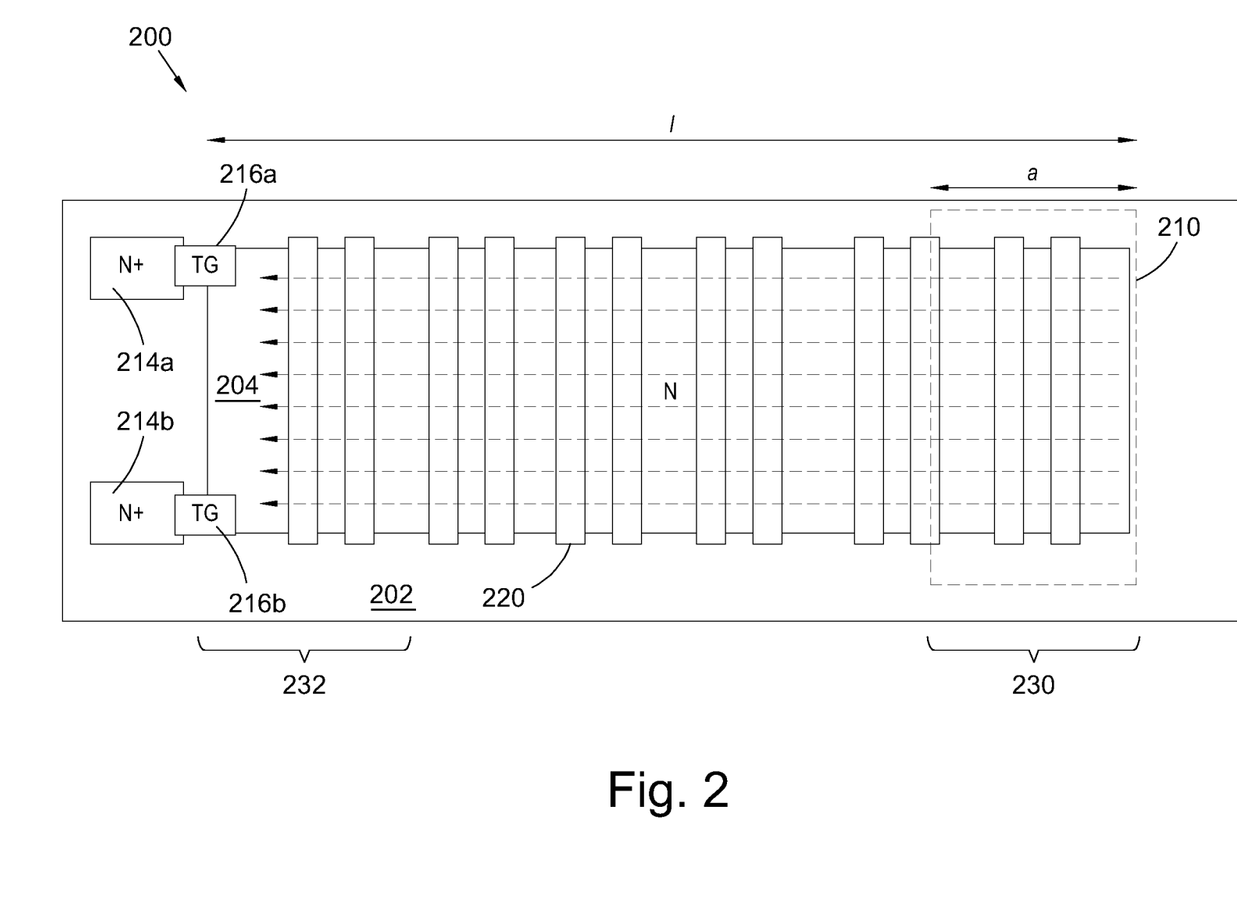

FIG. 2 shows a top view of an example demodulation pixel 200 of a time of flight sensor. The demodulation pixel 200 includes a charge generation region 204 defined in a semiconductor substrate 202. The charge generation region 204 can including multiple sub-regions, e.g., as discussed above for FIG. 1. Light is incident on the charge generation region 204 through an aperture 210 having a size a smaller than a lateral extent l of the charge generation region 204. In the example of FIG. 2, the aperture 210 is positioned at one end 230 of the charge generation region 204, and two collection regions 214a, 214b are positioned at an opposite end 232 of the charge generation region 204. A readout component 216a, 216b corresponding to each collection region 214 is operable to generate an electric field that opens a channel in the semiconductor substrate 202 below the readout component 216, enabling generated charge carriers to be collected in the collection regions 214.

Multiple light directing elements 220, such as diffractive optical elements, are positioned in the charge generation region 204. The light directing elements 220 are configured to direct, e.g., diffract, light, keeping the light (and hence the generation of charge carriers) generally close to the surface of the charge generation region and generally within or close to a depletion region formed in the charge generation region 204. The presence of the multiple light directing elements 220 enables the lateral extent l of the charge generation region 204 to be extended, e.g., such that there is a large distance between the aperture 210 where light is incident on the charge generation region 204 and the collection regions 214. This lateral extent can contribute to enhanced sensitivity of the demodulation pixel by extending the depletion region and hence increasing the interaction volume between the light and the depletion region.

In some examples, the lateral extent of the charge generation region 204 can be generally of a similar size as the penetration depth of the wavelength of the light. For instance, the absorption length in silicon of light of 940 nm wavelength is about 30 µm. In some examples, tor efficient charge carrier generation in a Si-based time of flight sensor, the light path can be contained by the light directing elements to be, e.g., less than about 10 µm from the silicon surface, e.g., about 1-5 µm or about 1-3 µm, such that charge carrier generation occurs generally within the depletion region. In some examples, the lateral extent of the charge generation region 204 can be, e.g., between about 10 µm and about 30 µm, e.g., to achieve high quantum efficiency and generally small pixel size.

Figure 3:
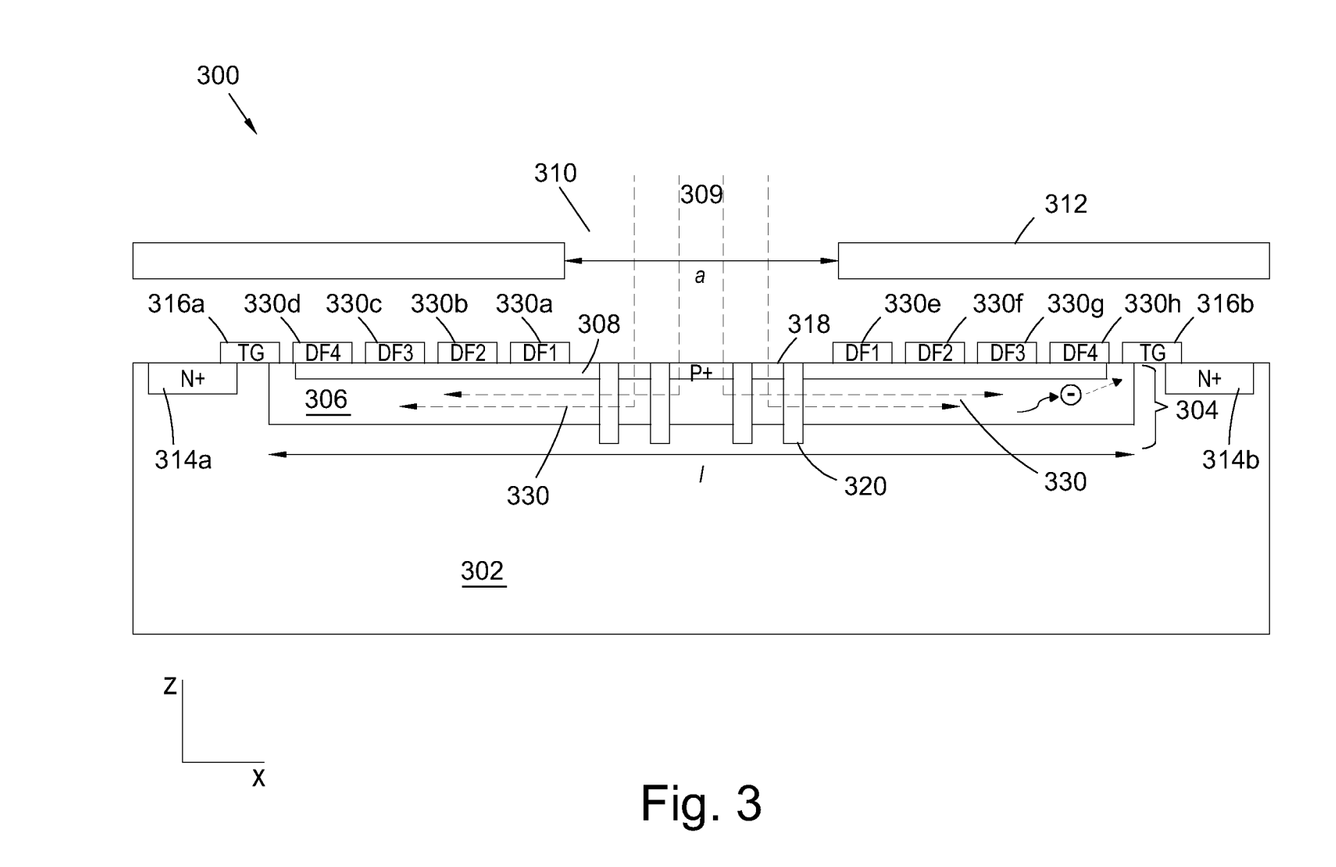

Referring to FIG. 3, an example demodulation pixel 300 of a time of flight sensor includes a charge generation region 304 defined in a semiconductor substrate 302. The charge generation region 304 can include multiple sub-regions, such as a deep n-type charge generation region 306 and a shallow p+-type implant region 308. The sub-regions 306, 308 cause the formation of a depletion region 330. Light 309 is incident on an area 318 of the charge generation region 304 through an aperture 310 defined in a shield layer 312. The aperture 310 has a size a smaller than a lateral extent l of the charge generation region 304. Collection regions 314a, 314b are positioned at opposite ends of the charge generation region 304, and corresponding readout components 316a, 316b are each operable to open a channel in the semiconductor substrate 302 to enable generated charge carriers to be collected in the collection regions 314. Light directing elements 320, such as diffractive optical elements, are positioned in the charge generation region 304 and configured to direct, e.g., diffract, light, keeping the light, and the photogenerated charge carriers, generally within or near the depletion region 330, as discussed above.

One or more electric field gates 330a-330h (collectively electric field gates 330) are disposed on a surface 305 of the charge generation region 304 between the area 318 of light incidence and the collection regions 314. A voltage can be applied to each electric field gate 330 to generate a potential gradient in the charge generation region 304 along its lateral extent l, e.g., between the area 318 of light incidence and each of the collection regions 314. The potential gradient facilitates the flow of generated charge carriers toward the collection regions 314, reducing the transfer time of the generated charges and thereby enhancing the efficiency of the demodulation pixel 300. For instance, a potential gradient can be generated by applying increasing voltages to the electric field gates with increasing distance from the area 318 of light incidence, such that electric field gates 330a, 330e have the smallest applied voltage and electric field gates 330d, 330h have the largest applied voltage. The potential gradient can be tuned (e.g., a magnitude or slope of the gradient can be adjusted) by controlling the number of electric field gates 330 having applied voltages and the relative magnitudes of the voltages applied to the electric field gates 330.

Figure 4:
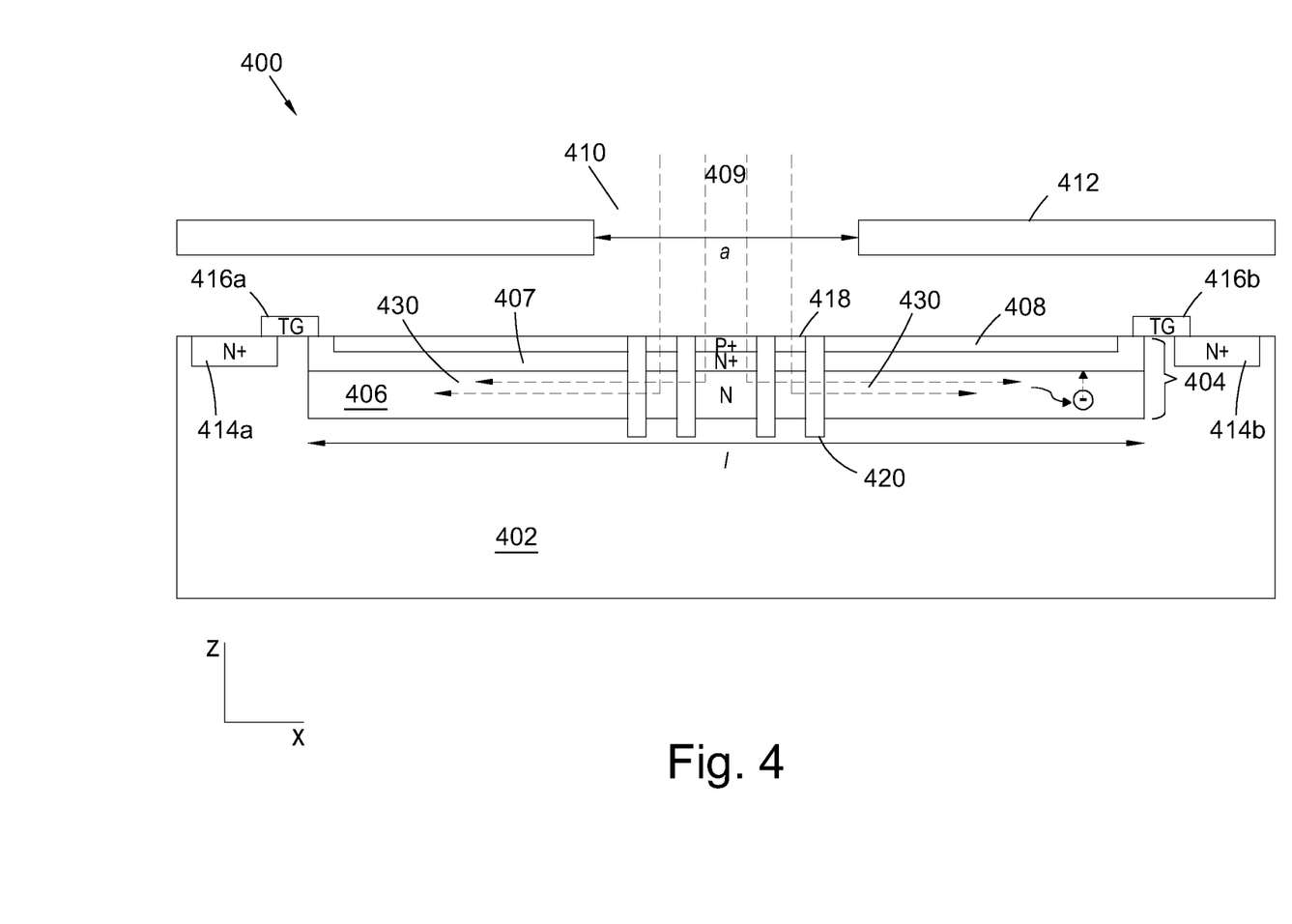

Referring to FIG. 4, an example demodulation pixel 400 of a time of flight sensor includes a charge generation region 404 defined in a semiconductor substrate 402, with a depletion region 430 existing in the charge generation region 404. Light 409 is incident on an area 418 of the charge generation region 404 through an aperture 410 defined in a shield layer 412. The aperture 410 has a size a smaller than a lateral extent l of the charge generation region 404. Collection regions 414a, 414b are positioned at opposite ends of the charge generation region 404, and corresponding readout components 416a, 416b are each operable to open a channel in the semiconductor substrate 402 to enable generated charge carriers to be collected in the collection regions 414. Light directing elements 420, such as diffractive optical elements, are positioned in the charge generation region 404 and configured to direct, e.g., diffract, light, keeping the light, and the photogenerated charge carriers, generally within or near the depletion region 430, as discussed above.

The charge generation region 404 includes multiple sub-regions of different doping types or concentrations. The resulting doping profile gives rise to a potential gradient in the charge generation region 404, which facilitates the flow of generated charge carriers toward the collection regions 414 and reduces the transfer time of the generated charges, thereby enhancing the efficiency of the demodulation pixel 400. For instance, the charge generation region 404 can include a deep n-type charge generation region 406, an n+-type collection region 407, and a shallow p+-type implant region 408. In some examples, the potential gradient in the charge generation region 404 can be tuned (e.g., a magnitude or slope of the gradient can be adjusted) by shaping one or more of the sub-regions, such as the n+-type collection region 407, or by introducing or tailoring a doping gradient between adjacent sub-regions.

Figure 5:
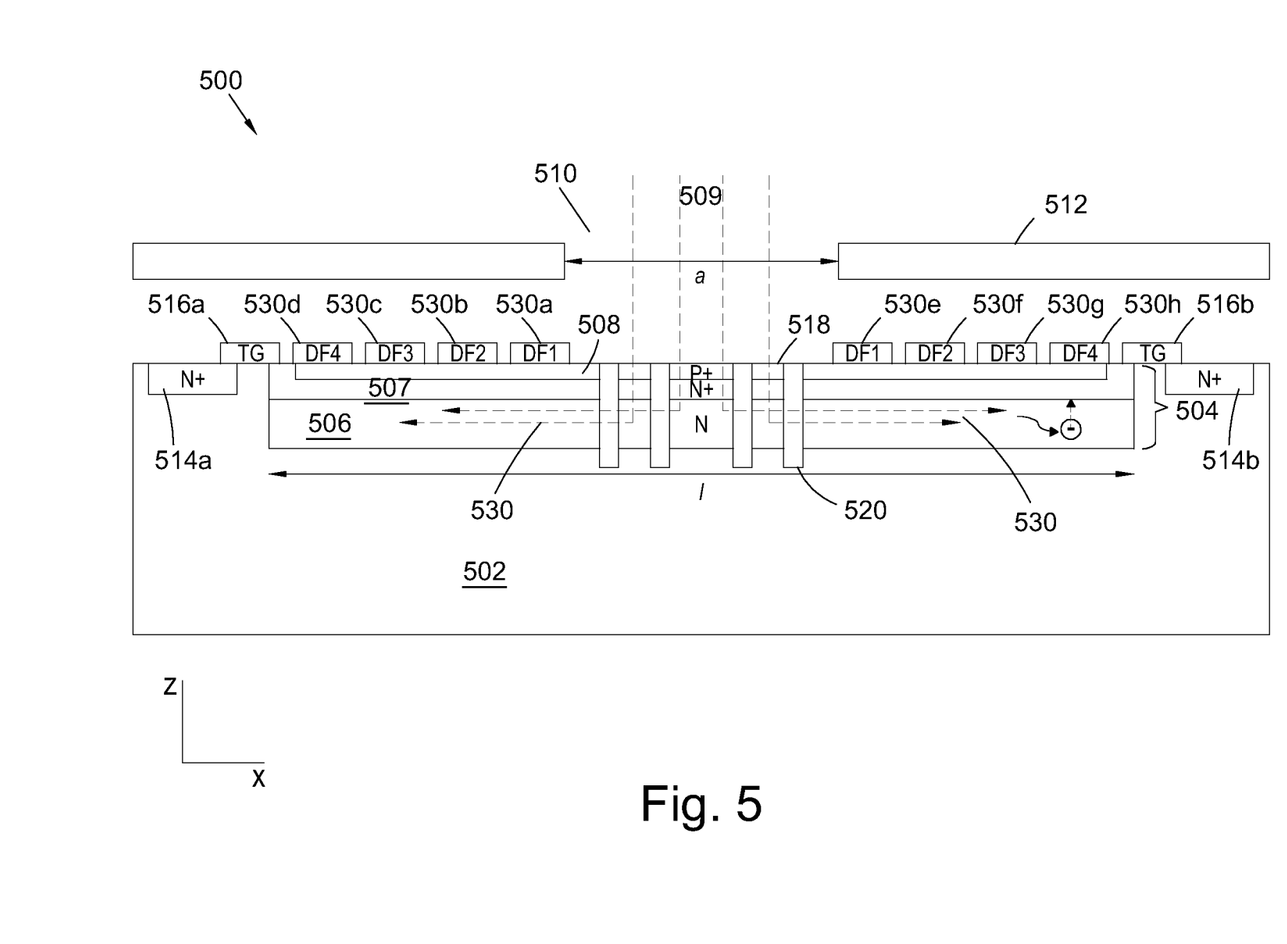

Referring to FIG. 5, an example demodulation pixel 500 of a time of flight sensor includes a charge generation region 504 defined in a semiconductor substrate 502, with a depletion region 530 existing in the charge generation region 504. Light 509 is incident on an area 518 of the charge generation region 504 through an aperture 510 defined in a shield layer 512. The aperture 510 has a size a smaller than a lateral extent l of the charge generation region 504. Collection regions 514a, 514b are positioned at opposite ends of the charge generation region 504, and corresponding readout components 516a, 516b are each operable to open a channel in the semiconductor substrate 502 to enable generated charge carriers to be collected in the collection regions 514. Light directing elements 520, such as diffractive optical elements, are positioned in the charge generation region 504 and configured to direct, e.g., diffract, light, keeping the light, and the photogenerated charge carriers, generally within or near the depletion region 530, as discussed above.

In the demodulation pixel 500, a potential gradient is generated in the charge generation region 504 in two ways: through the use of electric field gates 530a-530h and through the creation of a doping profile in sub-regions 506-508 of the charge generation region 504. The electric field gates 530a-530h operate as discussed above with respect to FIG. 3; the doping profile operates as discussed above with respect to FIG. 4. The resulting potential gradient facilitates the flow of generated charge carriers toward the collection regions 514, reducing the transfer time of the generated charges and thereby enhancing the efficiency of the demodulation pixel 500.

Figure 6:
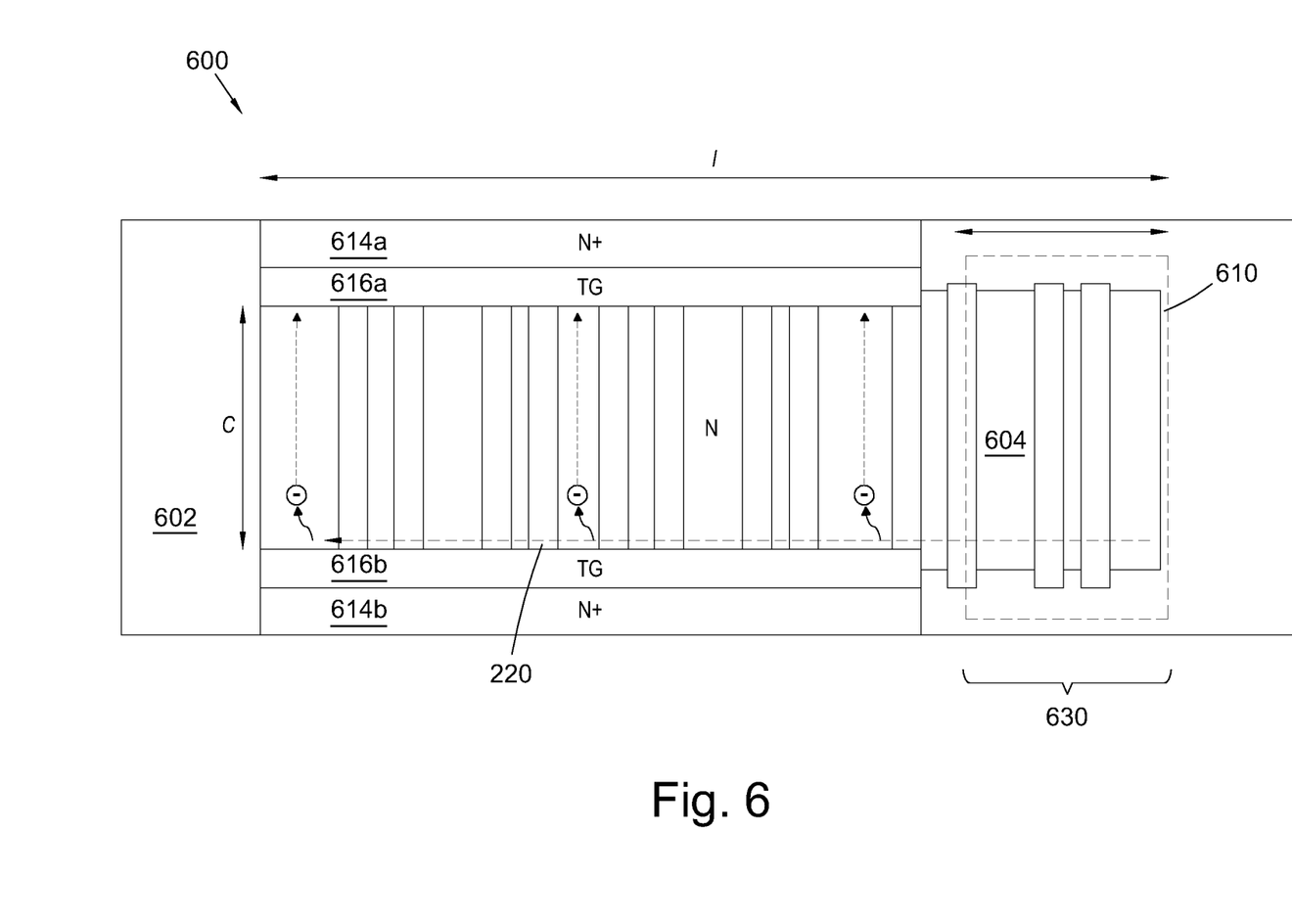

FIG. 6 shows a top view of an example demodulation pixel 600 of a time of flight sensor. The demodulation pixel 600 includes a charge generation region 604 defined in a semiconductor substrate 602. The charge generation region 604 can including multiple sub-regions, e.g., as discussed above. Light is incident on the charge generation region 604 through an aperture 610 having a size a smaller than a lateral extent l of the charge generation region 604. In the example of FIG. 6, the aperture 610 is positioned at one end 630 of the charge generation region 604. Light directing elements 620, such as diffractive optical elements, are positioned in the charge generation region 604 and configured to direct, e.g., diffract, light along the lateral extent l of the charge generation region 604 away from the end 630 of the charge generation region 604 (e.g., toward the left in the figure), keeping the light, and the photogenerated charge carriers, generally within or near the depletion region of the charge generation region 604, as discussed above.

Two collection regions 614a, 614b are positioned on opposite sides of the charge generation region 604. The collection regions 614 are oriented such that the light directing elements 620 direct the light substantially parallel to the collection regions 614 rather than toward the collection regions 614. Each collection region 614a, 614b is coupled to the charge generation region 604 by a corresponding readout component 616a, 616b.

The voltage on each readout component 616 can be controlled by a modulation scheme, e.g., such that the readout components 616 are activated in an alternating pattern. When the readout component 616a is activated by application of a voltage, charge carriers are collected in the collection region 614a. The applied voltage is then swapped to activate the readout component 616b, and charge carriers are collected in the collection region 614b. The modulated activation of the readout components 616 helps to enhance the speed of the demodulation pixel 600 by providing collection regions that are close to various areas in the charge generation region 604, e.g., such that generated charge carriers in any area of the charge generation region 604 have a nearby collection region.

In this demodulation pixel 600, the lateral extent l of the charge generation region 604 can be significantly larger than the distance c between the collection regions 614 (which is the maximum distance to be traveled by any charge carrier for collection). For instance, the lateral extent l of the charge generation region 604 can be at least twice, at least three times, at least five times, or at least 10 times the distance c between the collection regions 614. In a specific example, the charge generation region 604 has a lateral extent l of about 40 μm and the collection regions 614 are separated by a distance c of about 4 μm. The large lateral extent l of the charge generation region enhances sensitivity and quantum efficiency of the demodulation pixel by providing a large volume for charge carrier generation, while the smaller separation c between the collection regions 614 provides for rapid collection of the charge carriers and hence fast operation of the demodulation pixel 600.

In some examples, to further enhance the speed of the demodulation pixel, additional collection regions 614 and readout components 616 can be provided, e.g., in an interdigitated structure, such that the maximum distance between any generated charge carrier and a collection region is reduced.

Figure 7:
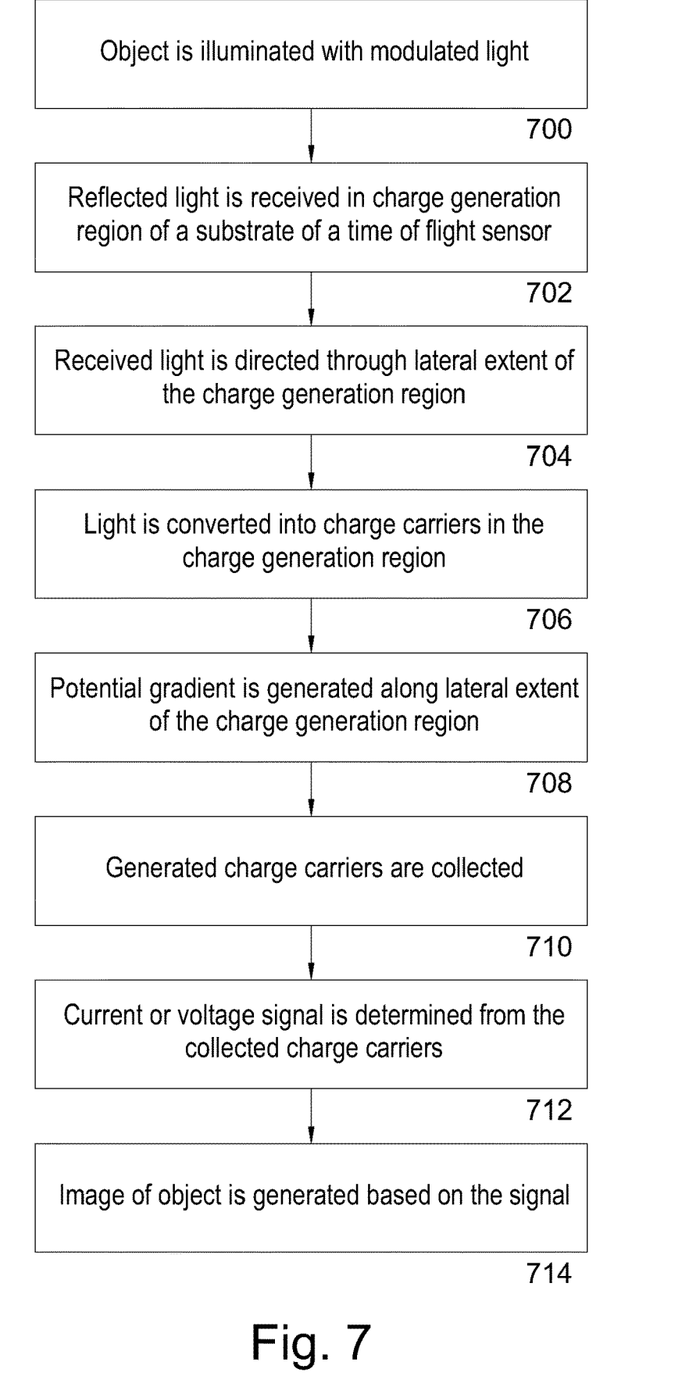
FIG. 7 is a flow chart.

Referring to FIG. 7, in an example approach for operating a time of flight sensor system incorporating one or more of the time of flight sensors described here, an object in an environment is illuminated with modulated light (700). Light reflected by the object is received in the charge generation region of a semiconductor substrate of the time of flight sensor (702). For instance, the light can be received through an aperture, with the aperture being smaller than a lateral extent of the charge generation region. Light in the charge generation region is directed through at least a portion of the lateral extent of the charge generation region by light directing elements, such as diffraction elements (704). In the charge generation region, the light is converted into charge carriers, such as electrons or holes (706).

In some examples, the generated charge carriers are caused to flow toward one or more collection regions by the generation of a potential gradient along at least a portion of the lateral extent of the charge generation region (708). For instance, the potential gradient can be generated by application of an electric field to each of one or more electric field gates, or by the presence of a doping gradient or differently doped sub-regions in the charge generation region. The charge carriers generated in at least a portion of the lateral extent of the charge generation region are collected in one or more collection regions (710). For instance, the charge carriers can be collected by controlling an electrical coupling between the charge generation region and the collection region, e.g., by applying a voltage to a readout component to create a channel in the semiconductor substrate between the charge generation region and the collection region.

A signal, such as a current or voltage signal, is determined from the charge carriers collected in the one or more collection regions (712) and an image of the object is generated based on the signal (714). For instance, the image can be a 3-D image of the object that is generated based on both the signal and a 2-D image of the object.

In some examples, the approaches described here for providing enhanced sensitivity to IR light can be applied to automotive light detection and ranging (LIDAR) applications, such as automotive LIDAR applications. In automotive LIDAR applications, pixel dimensions can be constrained only in a single direction, and such pixels can be provided with optical elements in their charge generation regions. In these examples, the size of the charge generation region can be enlarged significantly in one direction, increasing the sensitivity accordingly without an increase in the aperture for the incident light or an increase in the collection time.

Figure 8:
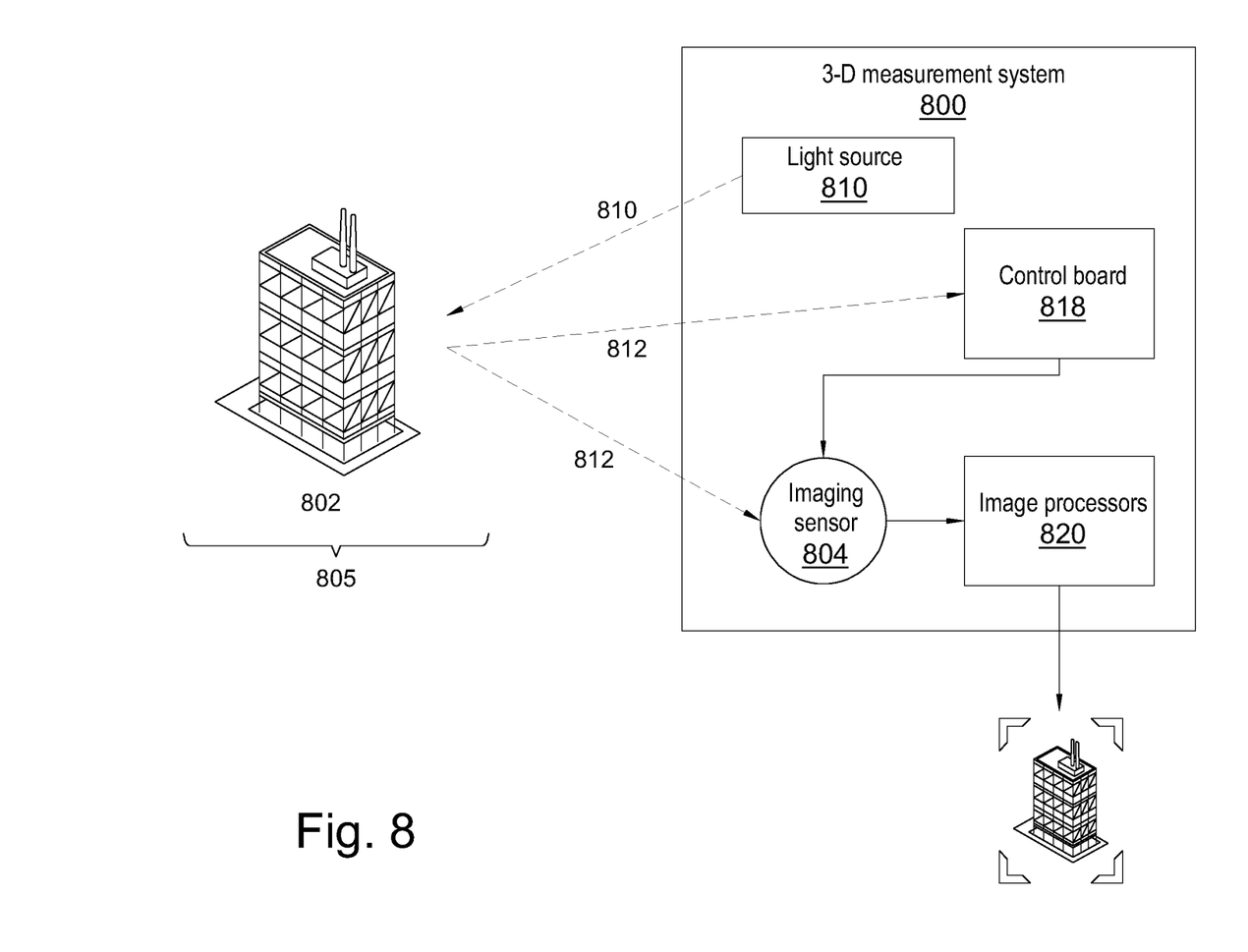
FIG. 8 is a system diagram.

Referring to FIG. 8, an example 3-D measurement system 800 employs time of flight sensing to generate a 3-D image of an object 802 (in this example, a building) in an environment 805 of the 3-D measurement system 800. The 3-D measurement system 800 includes an imaging sensor 804 that includes an array (e.g., a two-dimensional (2-D) array) of demodulation pixels, such as those described above.

The object 802 is illuminated with modulated illumination light 808 from a light source 810, such as a laser. For instance, the light 808 can be infrared (IR) light. Some of the illumination light is reflected by the object. The reflected light 812 is detected by the imaging sensor 804.

Each demodulation pixel of the imaging sensor 804 is capable of demodulating the received light signal 812. A control board 818 is configured to regulate the timing of the imaging sensor 804. The phase values of all pixels of the imaging sensor 804 correspond to distance information R for a corresponding point in the environment 805, e.g., on the building 802. The distance information from the pixels, in combination with a 2-D image of the environment, are converted into a 3-D image 822 of the environment 805 by one or more image processors 820. The image 822 can be displayed to a user, e.g., on a display of a computing device such as a mobile device, or can be used as a machine vision input.

The distance information R for each pixel can be calculated as:

$$R = \frac{c \cdot ToF}{2},$$

where c is the speed of light and ToF is the time of flight, which is the elapsed time between emission of light from the light source 810 and detection of the reflected light by the imaging sensor 804. With each demodulation pixel being capable of demodulating the reflected light concurrently, the imaging sensor 804 can deliver 3-D images in substantially real time, e.g., frame rates of up to 30 Hz or greater than 30 Hz. Increased lateral transfer time of the photogenerated charge carriers in the demodulated pixels can contribute to high frequency image delivery.

In some examples, the modulated illumination light can be pulse intensity modulated light, and the demodulation of the reflected light can deliver the time of flight value directly. In some examples, the modulated illumination light can be continuously intensity modulated light, and the demodulation of the reflected light can deliver the phase delay (P) between the emitted light and the reflected light. The phase delay corresponds to the distance R as follows:

$$R = \frac{P \cdot c}{4\pi f_{mod}},$$

where $f_{mod}$ is the modulation frequency of the illumination light, which can range from, e.g., a few MHz up to several GHz.

Figure 9:
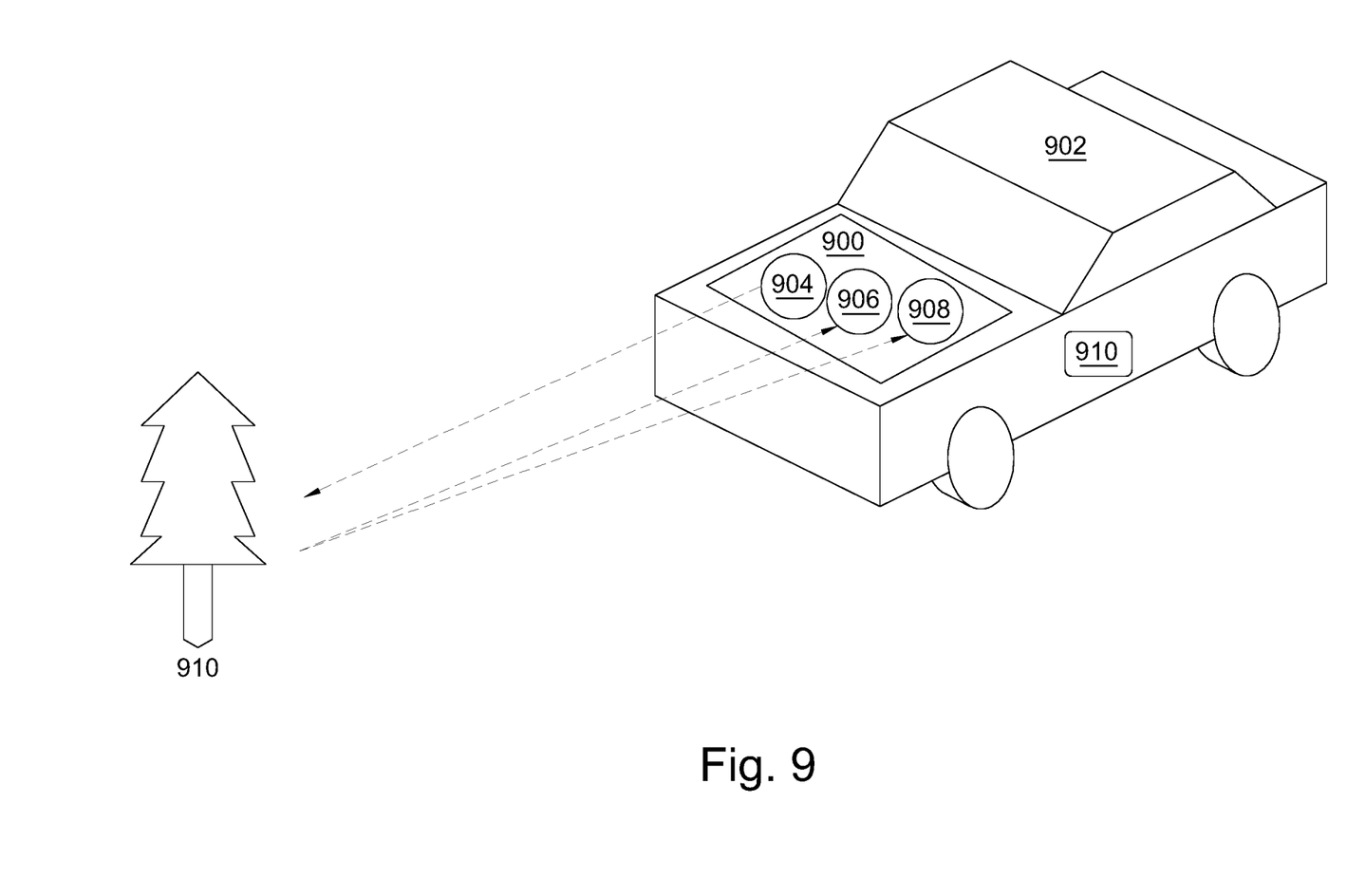
FIG. 9 is a diagram of a vehicle.

Referring to FIG. 9, in some examples, a 3-D imaging system 900 employing time of flight sensors such as those described here can be incorporated into a vehicle 902, such as a partially-autonomous or fully-autonomous vehicle. The vehicle can be a land-based vehicle (as shown), such as a car or truck; an aerial vehicle, such as an unmanned aerial vehicle; or a water-based vehicle, such as a ship or submarine. The 3-D imaging system 900 includes an illumination device 904 and imaging components including a camera 906 and a time of flight imaging sensor 908. The 3-D imaging system 900 can be used, e.g., for 3-D mapping of the environment of the vehicle 902. For instance, the 3-D imaging system 900 can be used to generate a 3-D image of an object 910, e.g., an object in or near a roadway on which the vehicle 902. By determining the 3-D shapes of various objects, a mapping of an environment of the vehicle can be determined and used to control the partially- or fully-autonomous operation of the vehicle 902, e.g., by a computing device 912 including one or more processors.

Figure 10A:
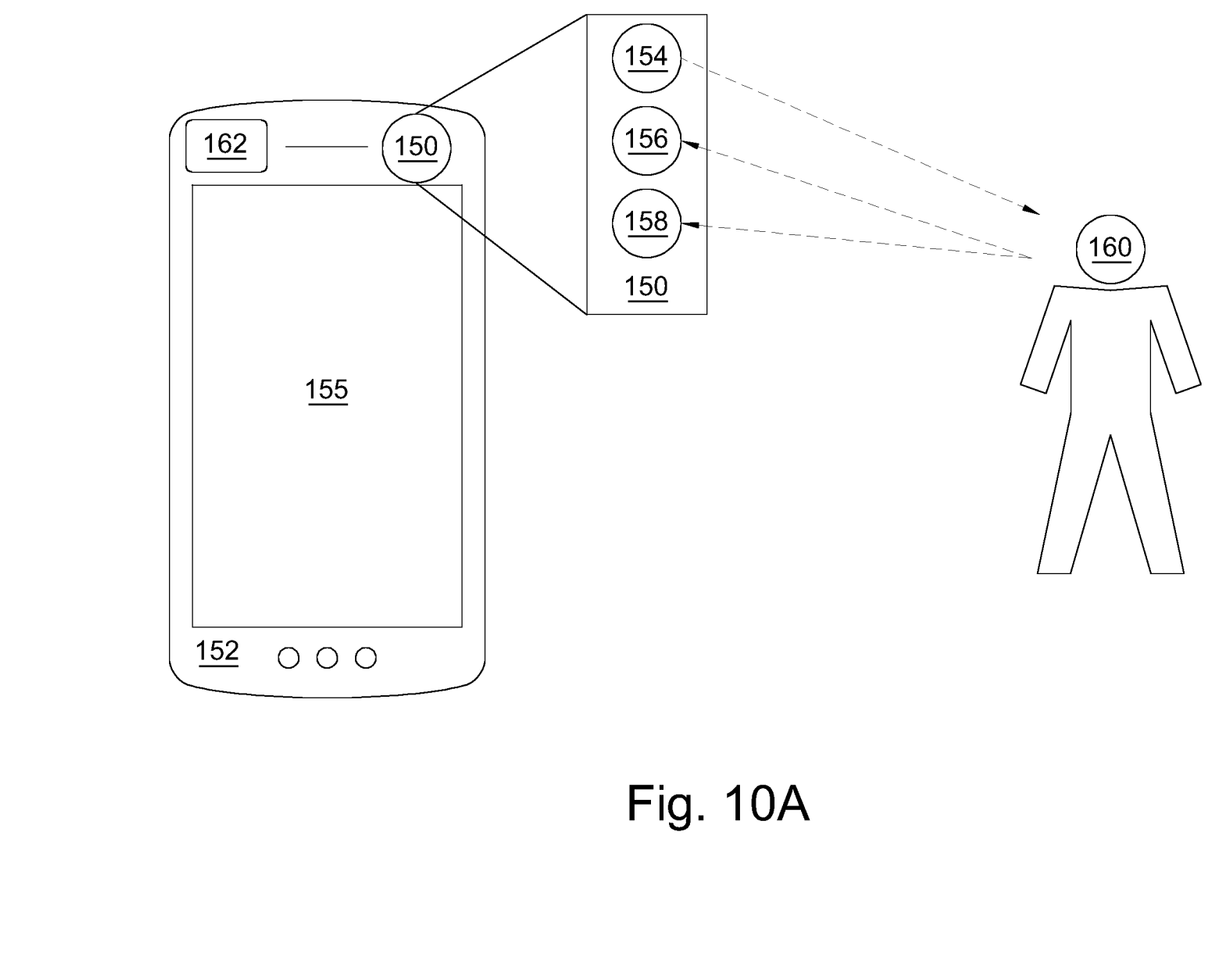
FIGS. 10A and 10B are diagrams of a mobile computing device.

Referring to FIG. 10A, in some examples, a 3-D imaging system 150 employing time of flight sensors such as those described here can be mounted on or incorporated into a front side of a mobile computing device 152, such as a mobile phone, a tablet, or a wearable computing device. The front side of the mobile device 152 is the side of the device that includes a screen 155. The 3-D imaging system 150 can be a front-side imaging system that includes an illumination device 154 and imaging components including a camera 156 and a time of flight imaging sensor 158. The front side 3-D imaging system 150 can be used for 3-D imaging applications, e.g., for facial recognition. For instance, the front side 3-D imaging system 150 can be used to generate an image of the a user's face 160, e.g., for facial recognition processing, e.g., by one or more processors 162 of the mobile computing device 152.

Figure 10B:
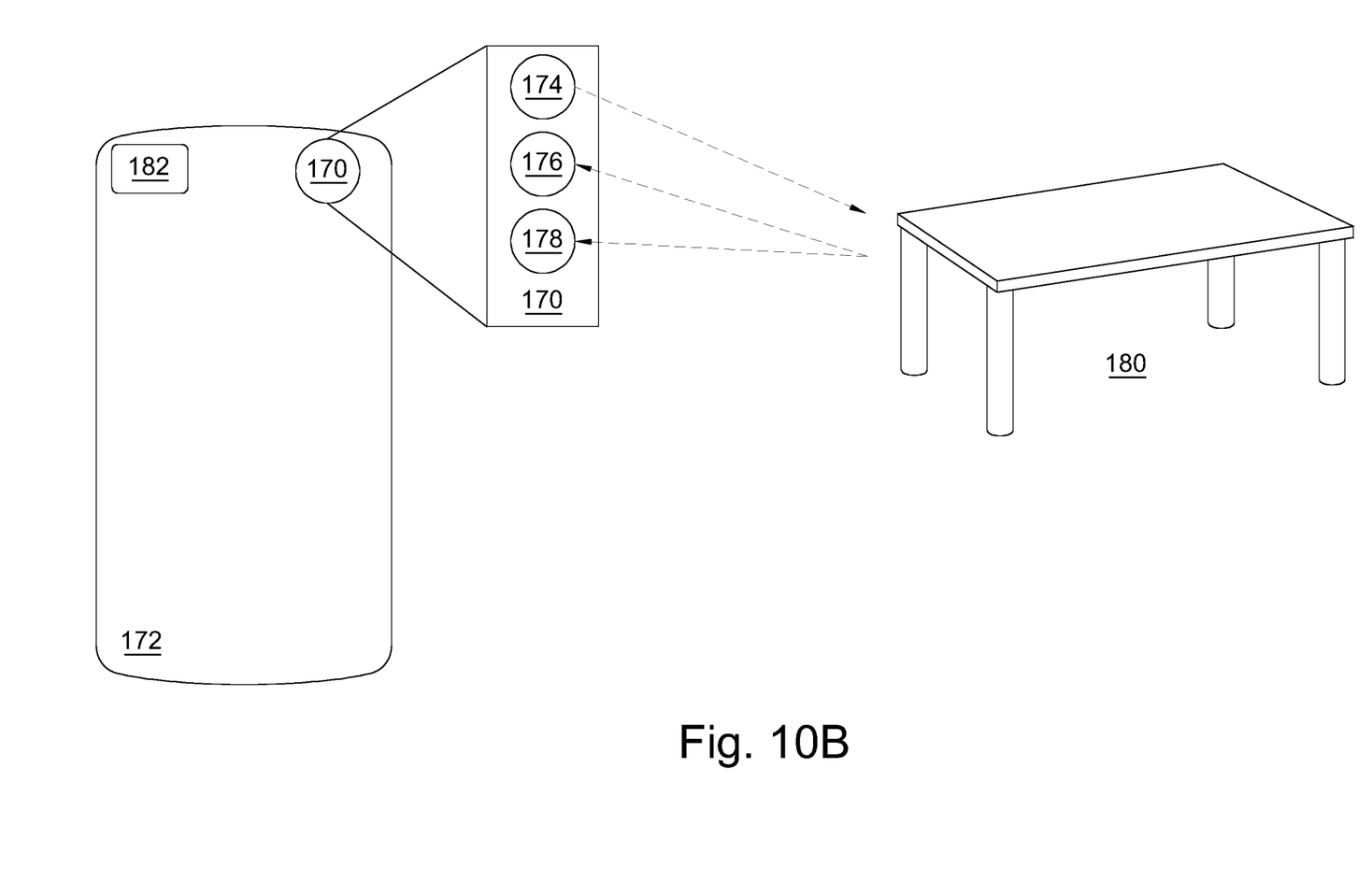

Referring to FIG. 10B, in some examples, a 3-D imaging system 170 employing time of flight sensors such as those described here can be mounted on a back side of a mobile computing device 172. The back side is the side of the device opposite the front side, such as the side that does not include a screen. The 3-D imaging system 170 can be a back-side imaging system that includes an illumination device 174 and imaging components including a camera 176 and a time of flight imaging sensor 178. The back-side 3-D imaging system 170 can be used, e.g., for object recognition or for environmental mapping, such as mapping of a room 180, e.g., by one or more processors 182.

3-D imaging systems employing time of flight sensors such as those described here can be incorporated into other devices, including game consoles, distance measuring devices, surveillance devices, and other devices.

A number of embodiments have been described. Nevertheless, it will be understood that various modifications may be made without departing from the spirit and scope of the invention. For example, some of the steps described above may be order independent, and thus can be performed in an order different from that described.

Other implementations are also within the scope of the following claims.

The invention claimed is:

1. A time of flight sensor comprising:
    at least one demodulation pixel, each demodulation pixel comprising:
        a semiconductor substrate;
        a charge generation region in the semiconductor substrate, the charge generation region having a lateral extent, the charge generation region being configured to convert light into charge carriers;
        a light directing element in the charge generation region of the semiconductor substrate, the light directing element being configured to direct light through at least a portion of the lateral extent of the charge generation region, wherein the light directing element is a diffractive element with a multilayer structure of trenches filled with at least two vertically oriented layers of materials;
        a collection region in the semiconductor substrate, the collection region being configured to collect the charge carriers generated in at least a portion of the lateral extent of the charge generation region, and
        a readout component in electrical communication with the collection region, the readout component being operable to control an electrical coupling between the charge generation region and the collection region.

2. The time of flight sensor of claim 1, comprising an aperture aligned with a portion of the charge generation region, the aperture being smaller than the lateral extent of the charge generation region.

3. The time of flight sensor of claim 1, in which each demodulation pixel comprises an electric field gate disposed on the charge generation region, the electric field gate being configured to generate a potential gradient along at least a portion of the lateral extent of the charge generation region.

4. The time of flight sensor of claim 1, in which the semiconductor substrate in the charge generation region has a doping gradient.

5. The time of flight sensor of claim 1, in which the charge generation region comprises multiple sub-regions, the semiconductor substrate in each of the sub-regions having a different doping concentration.

6. A time of flight sensor system comprising:
    a modulated light source; and
    a sensor configured to detect light generated by the modulated light source and reflected by an object, the sensor comprising the time of flight sensor of claim 1.

7. The time of flight sensor system of claim 6, comprising one or more processors configured to generate an image of the object based on a signal determined from the collected charge carriers and/or the one or more processors are further configured to generate a three-dimensional image of the object based on the signal and based on a two-dimensional image of the object.

8. The time of flight sensor system of claim 6, comprising one or more processors configured to determine a distance between the object and the sensor.

9. A method for operating a time of flight sensor, the method comprising:
    in a charge generation region of a semiconductor substrate of a demodulation pixel, converting light into charge carriers, the charge generation region having a lateral extent;
    directing light, by a light directing element, through at least a portion of the lateral extent of the charge generation region comprising diffracting light in the charge generation region; and
    collecting the charge carriers generated in at least a portion of the lateral extent of the charge generation region;
    wherein the light directing element is a diffractive element with a multilayer structure of trenches in the charge generation region filled with at least two vertically oriented layers of materials.

10. The method of claim 9, comprising receiving light in the charge generation region through an aperture, the aperture being smaller than the lateral extent of the charge generation region.

11. The method of claim 9, comprising controlling an electrical coupling between the charge generation region and a collection region in which the charge carriers are collected.

12. The method of claim 11, in which controlling an electrical coupling between the charge generation region and the collection region comprises applying a voltage to a readout component.

13. The method of claim 9, comprising generating a potential gradient along at least a portion of the lateral extent of the charge generation region.

14. The method of claim 13, in which generating a potential gradient comprises applying a voltage to each of one or more electric field gates disposed on the charge generation region.

15. The method of claim 13, in which generating a potential gradient comprises providing a doping gradient in the charge generation region of the semiconductor substrate.

16. The method of claim 9, comprising illuminating an object with modulated light; and receiving, at the charge generation region, light reflected by the object.

17. The method of claim 16, comprising generating an image of the object based on a signal determined from the collected charge carriers.

18. The method of claim 17, comprising generating a three-dimensional image of the object based on the signal and based on a two-dimensional image of the object.

* * * * *